(12) United States Patent
Chien et al.

(10) Patent No.: US 8,754,529 B2
(45) Date of Patent: Jun. 17, 2014

(54) MEMS DEVICE WITH SIMPLIFIED ELECTRICAL CONDUCTING PATHS

(75) Inventors: Yu-Hao Chien, Taipei (TW); Hua-Shu Wu, Hsinchu (TW); Shih-Yung Chung, Hsinchu County (TW); Li-Tien Tseng, Taoyuang County (TW); Yu-Te Yeh, Taichung County (TW)

(73) Assignee: Miradia, Inc., Santa Clara, CA (US)

( * ) Notice: Subject to any disclaimer, the term of this patent is extended or adjusted under 35 U.S.C. 154(b) by 0 days.

(21) Appl. No.: 13/401,075

(22) Filed: Feb. 21, 2012

(65) Prior Publication Data

US 2012/0248615 A1 Oct. 4, 2012

Related U.S. Application Data

(60) Provisional application No. 61/468,180, filed on Mar. 28, 2011.

(51) Int. Cl.
*H01L 23/48* (2006.01)
*H01L 21/50* (2006.01)

(52) U.S. Cl.
USPC ............ 257/770; 257/E23.011; 257/E21.499; 257/774; 257/741; 257/771; 257/668; 257/415; 257/417

(58) Field of Classification Search
USPC .......... 257/415, 417, E29.324, E21.499, 773, 257/774, 668, 741, 771, E23.011, 770; 438/107

See application file for complete search history.

(56) References Cited

U.S. PATENT DOCUMENTS

| | | | |
|---|---|---|---|
| 2004/0067604 A1* | 4/2004 | Ouellet et al. | 438/108 |
| 2005/0057641 A1* | 3/2005 | Ogihara et al. | 347/238 |
| 2005/0106318 A1* | 5/2005 | Partridge et al. | 427/248.1 |
| 2006/0208326 A1* | 9/2006 | Nasiri et al. | 257/414 |
| 2007/0017287 A1* | 1/2007 | Kubena et al. | 73/504.02 |
| 2008/0283990 A1* | 11/2008 | Nasiri et al. | 257/684 |
| 2009/0002915 A1* | 1/2009 | Ayazi et al. | 361/287 |
| 2009/0085191 A1* | 4/2009 | Najafi et al. | 257/698 |
| 2010/0027577 A1* | 2/2010 | Dutta | 372/50.1 |
| 2010/0126834 A1* | 5/2010 | Ikehashi | 200/181 |
| 2010/0203718 A1* | 8/2010 | Foster et al. | 438/597 |
| 2011/0049652 A1* | 3/2011 | Wu et al. | 257/417 |
| 2012/0223613 A1* | 9/2012 | Hung et al. | 310/300 |

* cited by examiner

Primary Examiner — Alexander Oscar Williams
(74) Attorney, Agent, or Firm — Rosenberg, Klein & Lee (57) ABSTRACT

A MEMS device comprises a substrate for manufacturing a moving MEMS component is divided into two electrically isolated conducting regions to allow the moving MEMS component and a circuit disposed on its surface to connect electrically with another substrate below respectively through their corresponding conducting regions, thereby the electrical conducting paths and manufacturing process can be simplified.

12 Claims, 8 Drawing Sheets

MEMS DEVICE WITH SIMPLIFIED ELECTRICAL CONDUCTING PATHS

REFERENCE TO RELATED APPLICATION

This Application is based on Provisional Patent Application Ser. No. 61/468,180, filed 28 Mar. 2011.

BACKGROUND OF THE INVENTION

1. Field of the Invention

The present invention is related to a MEMS device, and more particularly to a MEMS device with simplified electrical conducting paths.

2. Description of the Prior Art

Since the conceptualization of microelectrical mechanical system (MEMS) devices in the 1970's, they have progressed from laboratory curiosity to integration in high-end systems, and, more recently, to widespread application in popular consumer devices. A MEMS device including a moving component achieves various functions of the MEMS device by sensing or controlling the physical quantity of the movements of the moving component.

In order to increase the level of integration or functionalities for a MEMS device such as a magnetic sensor, the required circuit may be disposed on a surface of a moving MEMS component. However, according to prior art MEMS devices, a circuit disposed on a surface of a moving MEMS component is electrically connected with a substrate or to the outside by means of wire bonding. In such way, not only the complexity of the manufacturing process is increased, but a larger area of the substrate is also occupied, thereby hindering the progress of volume reduction of the MEMS device.

Therefore, it is highly desirable that the electrical conducting paths of the MEMS device to be simplified so as to raise the level of integration of the MEMS device.

SUMMARY OF THE INVENTION

The present invention is directed to a MEMS device and a manufacturing process thereof. Particularly, a substrate for manufacturing a moving MEMS component is divided into two electrically isolated conducting regions to allow the moving MEMS component and a circuit disposed on its surface to connect electrically with another substrate below respectively through their corresponding conducting regions, thereby simplifying the electrical conducting paths and manufacturing process.

According to an embodiment, a MEMS device includes a first substrate, a second substrate and a third substrate. The first substrate includes at least a first circuit disposed on a surface of the first substrate. The second substrate has a first surface and a second surface, and includes a MEMS component, a conducting part and a second circuit. The MEMS component is divided from the second substrate, disposed on the surface of the first substrate with the first surface facing towards the first substrate, and is electrically connected with the first circuit. The conducting part is divided from the second substrate, electrically isolated from the MEMS component, and electrically connected with the first circuit. The second circuit is disposed on the second surface of the MEMS component, electrically isolated from the MEMS component, and electrically connected with the first circuit via the conducting part. The third substrate has a recessed region and a plurality of standoff structures. It is disposed over the second substrate, and connects to the first substrate with the standoff structures such that the second substrate is enclosed in the recessed region.

The objective, technologies, features and advantages of the present invention will become apparent from the following description in conjunction with the accompanying drawings wherein certain embodiments of the present invention are set forth by way of illustration and example.

BRIEF DESCRIPTION OF THE DRAWINGS

The foregoing conceptions and their accompanying advantages of this invention will become more readily appreciated after being better understood by referring to the following detailed description, in conjunction with the accompanying drawings, wherein:

FIG. 4A to FIG. 4L are schematic sectional diagrams illustrating the steps of the manufacturing process of the MEMS device according to an embodiment of the present invention.

DESCRIPTION OF THE PREFERRED EMBODIMENT

The detailed explanation of the present invention is described as follows. The described preferred embodiments are presented for purposes of illustrations and description, and they are not intended to limit the scope of the present invention.

According to the embodiments of the present invention, semiconductor processing techniques are provided. More particularly, embodiments of the present invention include a method using semiconductor fabrication techniques to form a MEMS device. Merely by way of example, an embodiment provides a method of forming motion sensors, gyroscopes and magnetic sensors using a monolithic integration process. The method and structure can be applied to other applications as well, such as actuators, sensors and detectors.

Figure 1:
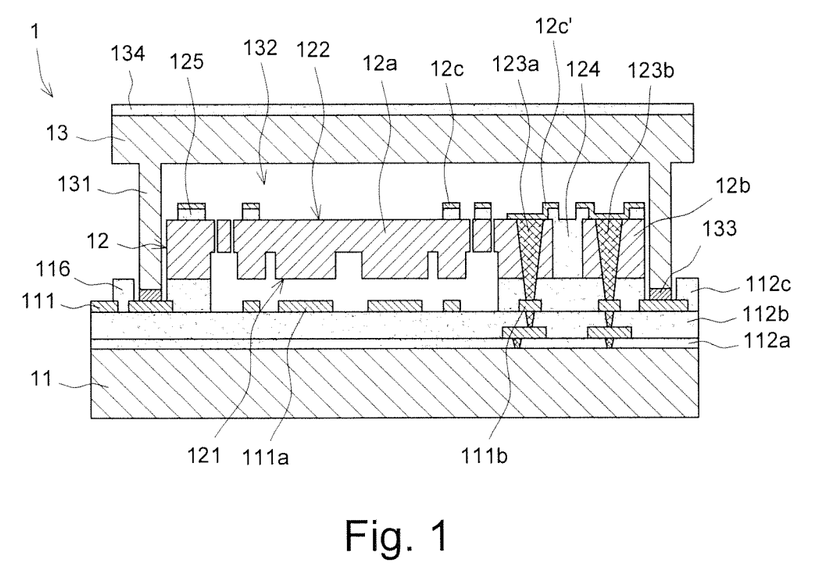
FIG. 1 is a schematic sectional diagram illustrating the MEMS device according to an embodiment of the present invention.
Figure 2:
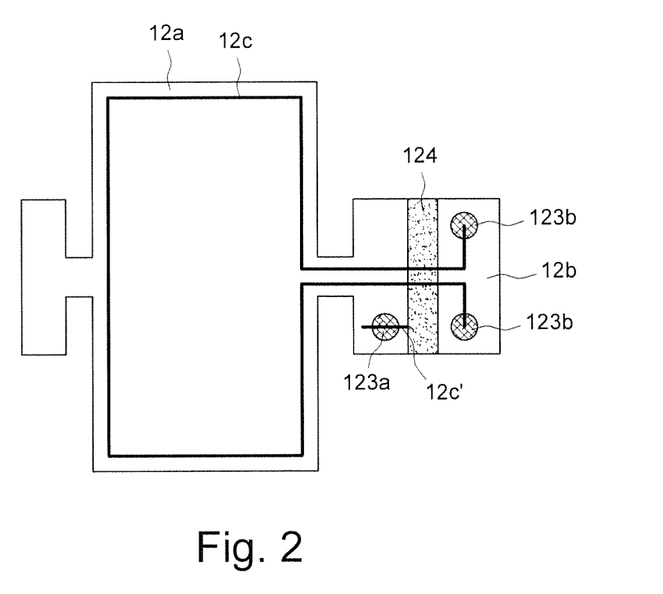
FIG. 2 is a top-view diagram illustrating the second substrate of the MEMS device according to an embodiment of the present invention.

Referring to FIG. 1 and FIG. 2, a MEMS device 1 in accordance with an embodiment of the present invention includes a first substrate 11, a second substrate 12 and a third substrate 13. The first substrate 11, according to an embodiment, may be a silicon substrate. The first substrate 11 includes at least a first circuit 111 disposed on the top surface of the first substrate 11. The first circuit 111, for example, may include one or more electrodes 111a and a plurality of conductive contacts 111b. Preferably, the first circuit 111 may include a CMOS element.

The second substrate 12 has a first surface 121 and a second surface 122. The second substrate 12 includes one or more moving MEMS components 12a, a conducting part 12b and a second circuit 12c. The MEMS component 12a is disposed on the top surface of the first substrate 11 with the first surface 121 facing towards the first substrate 11, and is electrically connected with the conductive contact 111b of the first circuit 111. For example, the MEMS component 12a may include a conducting via 123a. The conducting via 123a penetrates through the first surface 121 and the second surface 122 of the MEMS component 12a, and is electrically connected to the conductive contact 111b of the first circuit 111 and electrically connected with the MEMS component 12a through an ohmic contact. The ohmic contact may be formed with the second surface 122 of the MEMS component 12a, the wall of a through-hole in the MEMS component 123a for accommodating the conducting via 123a and/or the first surface 121 of the MEMS component 123a. Where the ohmic contact is formed with the second surface 122 of the MEMS component 12a, the MEMS component 12a may further include a conductive layer 12c' electrically isolated from the second circuit 12c. The conductive layer 12c' is electrically connected to the conducting via 123a and forms the ohmic contact with the second surface 122 of the MEMS component 12a so that the MEMS component 12a is electrically connected with the first circuit 111 through its second surface 122 and the conducting via 123a. The conducting via 123a may further have an overhang on its top so that the ohmic contact with the second surface 122 of the MEMS component 12a is more intact. Where the ohmic contact is formed with the wall of the through-hole accommodating the conducting via 123a, a conductive layer may be formed on the side wall of the through-hole to form the ohmic contact with the MEMS component 12a as in the case where the conductive layer 12c' is formed on the second surface 122 of the MEMS component 12a. Where the ohmic contact is formed with the first surface 121 of the MEMS component 123a, the depth of the conducting via may be reduced and there may also be a conductive layer disposed on the first substrate 11 to form the ohmic contact with the first surface 121 of the MEMS component 12a as in the case where conductive layer 12c' is formed on the second surface 122 of the MEMS component 12a.

Continuing the above description, the conducting part 12b and the MEMS component 12a are electrically isolated. For example, a trench 124 may be disposed in the second substrate 12, and filled with dielectric material so as to insulate the conducting part 12b from the MEMS component 12a. The conducting part 12b is electrically connected to the conductive contact 111b of the first circuit 111. The second circuit 12c is disposed on the second surface 122 of the MEMS component 12a and is electrically isolated from the MEMS component 12a. For example, a dielectric layer 125 and the second circuit 12c may be sequentially disposed on the second surface 122 of the MEMS component 12a so that the second circuit 12c and the MEMS component 12a are electrically isolated. The second circuit 12c is electrically connected to the conducting part 12b and is therefore electrically connected with the conductive contact 111b of the first circuit 111 via the conducting part 12b. The conducting part 12b, for instance, may include a conducting via 123b penetrating the first surface 121 and the second surface 122 of the conducting part 12b, and electrically connected to the conductive contact 111b of the first circuit 111. Connecting electrically to the conducting via 123b, the second circuit 12c may then be electrically connected with the first circuit 111.

The third substrate 13 includes a plurality of standoff structures 131 bordering a recessed region 132. The third substrate 13 is disposed over the second substrate 12 and connects with the first substrate 11 through the standoff structures 131 such that the second substrate 12 is enclosed in the recessed region of the third substrate 13. According to an embodiment, the third substrate 13 is electrically conductive, and the standoff structures 131 thereof have bonding pads 133 configured on their ends. The third substrate 13 is eutectically bonded with the first substrate 11 such that the bonding pad 133 and the bonded region of the first substrate 11 form a low resistance contact. For example, the third substrate 13 includes at least one of doped silicon, ceramic with conductive plating, glass with a tin oxide (ITO) coating, and tantalum oxide. Preferably, a dielectric layer 134 may be formed on the top surface of the third substrate 13.

According to structures illustrated in FIG. 1 and FIG. 2, the second substrate 12 includes a first electrical conducting path from the MEMS element 12a through the conducting via 123a to the first circuit 111 of the first substrate 11, and a second conducting path from the second circuit 12c disposed on the second surface 122 of the MEMS element 12a through the conducting via 123b to the first circuit 111 of the first substrate 11, and the first conducting path and the second conducting path are electrically isolated from each other. Hence, the first substrate 11 and the second substrate 12 may be integrated vertically, and require a smaller substrate area.

Figure 3A:
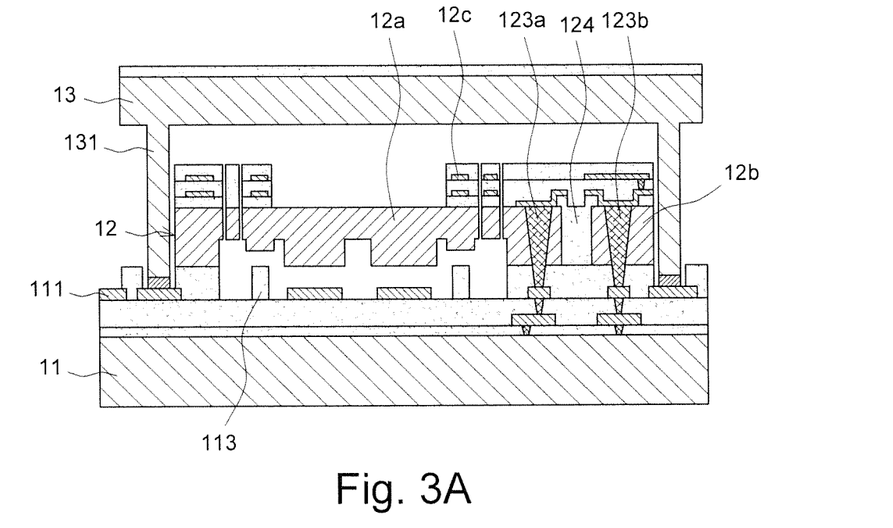
FIG. 3A is a schematic sectional diagram illustrating the MEMS device according to another embodiment of the present invention.

One of ordinary skill in the art would recognize many variations, modifications and alternatives of the present invention. For example, referring to FIG. 3A, the second circuit 12c disposed on the second surface 122 of the MEMS component 12a may include multiple circuit layers. In another example, a mechanical stopping structure 113 is disposed on the top surface of the first substrate 11. According to an embodiment, the second substrate 12 may be a silicon-based substrate such as a single crystal silicon substrate. In an embodiment illustrated in FIG. 3B the second substrate 12 is a doped low resistance silicon substrate. Then by depositing a conductive layer on the second surface 122 of the second substrate 12, and patterning and etching the conductive layer, two independent electrical conducting paths may be formed, one from the MEMS component 12a through a bonding pad 126a to the first circuit 111, and the other from the second circuit 12c through the silicon substrate and a bonding pad 126b of the conducting part 12b to the first circuit 111. Some further divisions to the conducting part 12b may be necessary to prevent shortage of different terminals of the second circuit 12c according to some designs.

It is noted that some characteristics described in the embodiments above are optional and may be used according to different processes or applications. Although described in different embodiments, these characteristics, such as the fence post 116 according to the embodiment illustrated in FIG. 1, the multiple circuit layers according to the embodiment illustrated in FIG. 3A and the mechanical stopping structure 113 according to the embodiment illustrated in FIG. 3A may be used independently or in combination.

Referring to FIG. 4A to FIG. 4L, there are illustrated steps of a manufacturing process of the MEMS device illustrated in FIG. 1 according to an embodiment. The manufacturing process starts with a first substrate 11. The first substrate 11 includes driving and/or sensing circuitry, and the like. Typically implemented using ASIC design elements, analog and/or digital circuits may be utilized in the substrate. The first substrate 11 may also be referred to as the electrode substrate. According to embodiments of the present invention, the first substrate 11 may be any suitable substrate having appropriate mechanical rigidity, including a CMOS substrate, glass substrate or the like. Although a single device is illustrated in these sectional diagrams, it will be appreciated that multiple dies are fabricated on a single substrate. Thus, the single device illustrated in these figures is only representative and is not intended to limit the present invention to fabrication methods for a single device. As described more fully throughout the present specification, wafer-scale processing is utilized to fabricate multiple dies or devices per substrate. After fabrication of the devices, dicing and singulation techniques are utilized to produce single device packages for use in various applications.

Figure 4A:
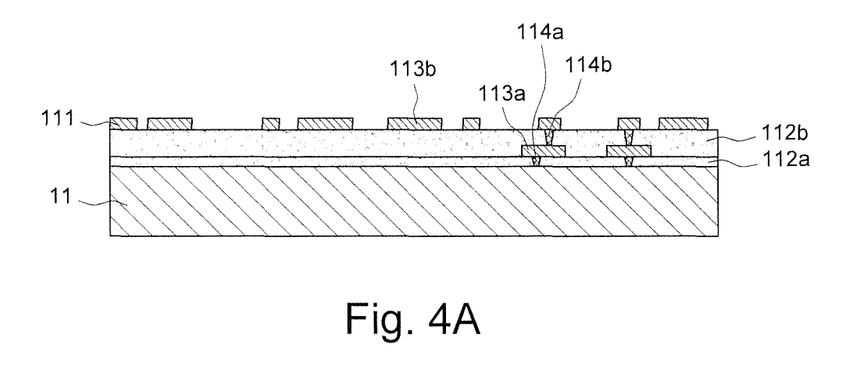

As illustrated in FIG. 4A, a dielectric layer 112a having a predetermined thickness is disposed on the first substrate 11. According to an embodiment, the dielectric layer 112a may be a silicon dioxide ($SiO_2$) layer. However, the present invention is not limited to be implemented as such. Other suitable materials may also be used within the scope of the present invention. For example, in alternative embodiments, a silicon nitride ($Si_3N_4$) layer or silicon oxynitride (SiON) layer may be deposited to form the first dielectric layer 112a. Moreover, in another embodiment, polysilicon material, including amorphous polysilicon, may be deposited to form the first dielectric layer 112a. Materials with suitable characteristics, including formation of a strong bond with the first substrate 11, good adhesion to the first substrate 11, and mechanical rigidity, are acceptable substitutes for $Si_xO_y$ materials. Buffer layers can be used in the deposition of the first dielectric layer 112a as appropriate to the particular application.

The first dielectric layer 112a has a predetermined thickness as initially deposited. In an embodiment, the predetermined thickness is about 1 μm. In other embodiments, the thickness ranges from about 0.01 μm to about 10 μm. Of course, the thickness will depend on the particular applications. In some embodiments, the first dielectric layer 112a is formed using multiple deposition and polishing steps to form the final layer. As an example, an HDP deposition process could be used to form a first portion of the layer, which is then polished using CMP. Because the device features have varying density as a function of lateral position, the deposited layers may not have a uniform upper surface. Thus, using a multi-step deposition/polish process, a flat and uniform surface can be fabricated. Examples of deposition techniques include TEOS. HDP, CVD, LPCVD, Thermal Oxidation and the like. Additionally, other materials could be utilized that are capped with a final layer, for example, oxide.

In some embodiments of the present invention, the process used to deposit the first dielectric layer 112a is performed in light of the structures present on the substrate. For example, in the instance that the first substrate 11 is a CMOS substrate, some circuitry on the substrate may be adversely impacted by performing high temperature deposition processes, as these high temperature deposition processes may damage metals or result in diffusion of junctions associated with the circuitry. Thus, in a particular embodiment, low temperature deposition, patterning and etching processes, such as processes performed at temperatures of less than 500° C., are used to form the layers illustrated in FIGS. 4A-4L. In another specific embodiment, deposition, patterning, and etching processes performed at less than 450° C., are used to form the various illustrated layers. After forming the first dielectric layer 112a, it is patterned and etched to form a plurality of first interconnect vias 114a. The first interconnect vias 114a provide electrical connection between the circuitry of the first substrate 11 and the subsequent first metal layer 113a that are formed over the first dielectric layer 112a as described more fully below.

A first metal layer 113a is then deposited over the first dielectric layer 112a. The first metal layer 113a also fills the first interconnect vias 114a. In some embodiments, the vias 114a may be filled separately using a conductive material like tungsten (W). In an embodiment, the first metal layer 113a is deposited using electroplating, physical vapor deposition (PVD) or a CVD process. FIG. 4A illustrates the first substrate 11 and the patterned first metal layer 113a after an etching process. For purposes of clarity, a photolithography process in which a photoresist layer is deposited on the first metal layer 113a and patterned to form an etch mask is not shown in this process flow. The dimensions of the etch mask may be tightly controlled during photolithography and the etch mask may be formed from any suitable material that is resistant to the etching process used to etch the metal layer. In a specific embodiment, an etch mask of silicon nitride ($Si_3N_4$) is utilized. Although a one dimensional cross section is illustrated in FIG. 4A, it will be evident to one of ordinary skill in the art that a two-dimensional pattern of the desired geometry is formed in the metal layer. In some embodiments, the first metal layer 113a may include aluminum, copper, aluminum-copper-silicon alloys, tungsten, and titanium nitride. In some embodiments, the thickness of the first metal layer 113a can be between 0.1 μm to 5 μm. In a particular embodiment, the thickness of the first metal layer 113a is 0.5 μm.

Thereafter, a second dielectric layer 112b is deposited over the first metal layer 113a. The process of forming the second dielectric layer 112b and the composition of the second dielectric layer 208 is similar to the first dielectric layer 112a in some embodiments. In other embodiments, the second dielectric layer 112b utilizes different materials and processes than those associated with the first dielectric layer 112a. In yet other embodiments, both similarities and differences are found between these two layers. After forming the second dielectric layer 112b, it is patterned and etched to form a plurality of second interconnect vias 114b. The second interconnect vias 114b provide electrical connection between the first metal layer 112a and the subsequent second metal layer 113b that is formed over the second dielectric layer 112b as described more fully below.

A second metal layer 113b is then deposited over the second dielectric layer 112b. The second metal layer 113b also fills the second interconnect vias 114b. In some embodiments, the vias 114b may be filled separately using a conductive material like tungsten (W). The second metal layer 113b is patterned to form electrodes of the MEMS device, such as sensing and driving electrodes, or to form bonding regions with the second substrate 12 and the third substrate 13. The bonding regions include an electrically conductive material with sufficient structural mechanical rigidity to support a bonding interface. In a specific embodiment, the bonding regions form a low resistance ohmic contact with the first substrate 11. In some embodiments, the bonding regions may include germanium, aluminum or copper. In other embodiments, other materials such as gold, indium and other solders with underneath adhesion and wetting improvement metal stacks may be used for bonding regions.

Figure 4B:
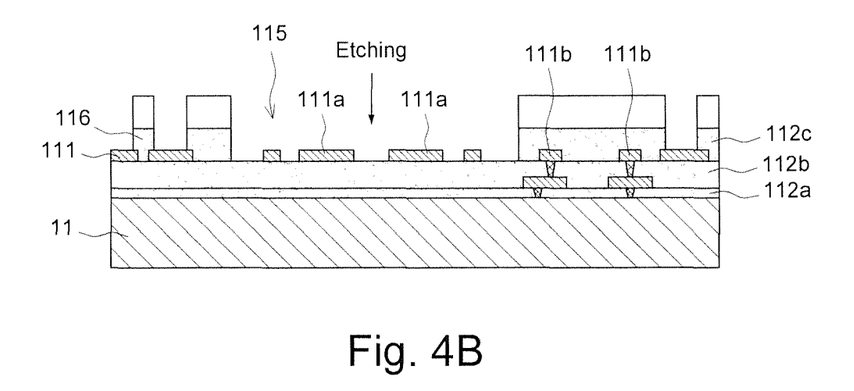

Referring to FIG. 4B, a third dielectric layer 112c is deposited over the second dielectric layer 112b. The deposition process for the third dielectric layer 112c may be the same as the second dielectric layer 112b illustrated in FIG. 4A described above. Thereafter, the third dielectric layer 112c is patterned to form a plurality of fence posts 116 and a recessed region 115 to accommodate one or more MEMS components. The plurality of fence posts 116 surround the bonding places to prevent the migration of the metal in such area into the surrounding areas during the process of bonding, causing device breakdown. The etching process may include one or more etching processes, such as anisotropic etch, oxide etch, reactive ion etch (RIE), and the like. According to an embodiment, the etching process also defines one or more mechanical stopping structures 113 for the MEMS device as in the embodiment illustrated in FIG. 3A. According to an embodiment, one or more buffer layers may be utilized as etch stop layers. One of ordinary skill in the art would recognize many variations, modifications and alternatives.

Figure 4C:
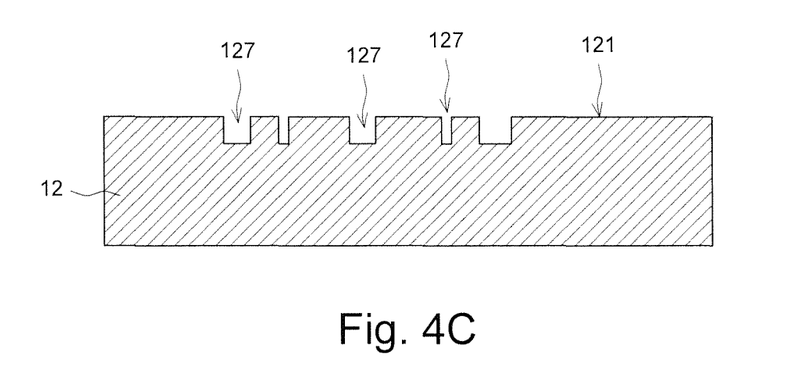

Referring to FIG. 4C, there is illustrated a second substrate 12. A plurality of cavities 127 may be formed on a first surface 121 of the second substrate 12. According to an embodiment, the cavities may be between 1 μm and 500 μm deep. The cavities help to reduce noise from the first substrate 11 when the second substrate 12 is bonded to the first substrate 11. In some embodiments, each cavity 127 may be of different depth than other cavities, enabling creation of a customized second substrate 12. According to an embodiment, the thickness of the second substrate varies as a function of position along one or more directions orthogonal to the thickness of the second substrate 12, i.e., along directions aligned with the surface of the second substrate 12.

Figure 3B:
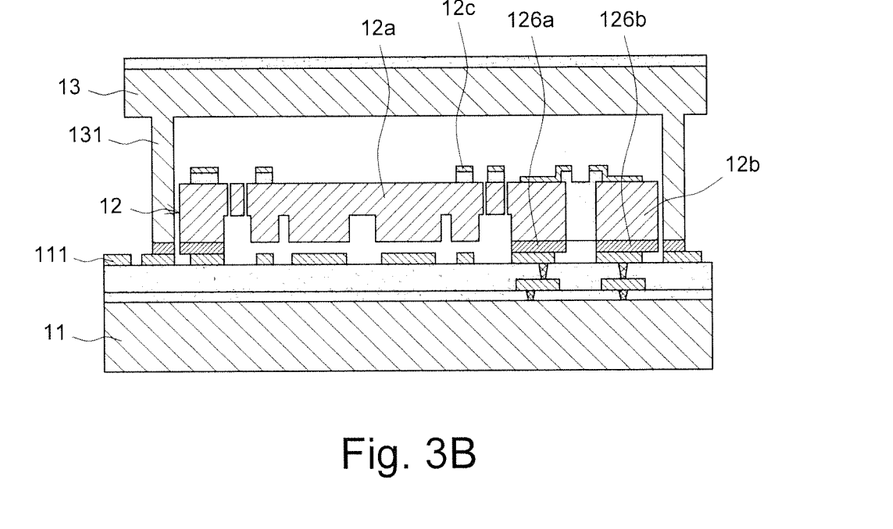
FIG. 3B is a schematic sectional diagram illustrating the MEMS device according to yet another embodiment of the present invention.

In another embodiment, a conductive layer is deposited on the first surface 121 of the second substrate 12. Then the conductive layer is patterned and etched to form a plurality of bonding pads 126a, 126b, as illustrated in FIG. 3B. The thickness of the bonding pads 126a, 126b is between 0.1 μm and 1 μm. In a particular embodiment, the bonding pads 126a, 126b may include an aluminum-copper alloy. It is noted that the bonding pads 126a, 126b may also be disposed on the first substrate 11 for the subsequent bonding process.

Figure 4D:
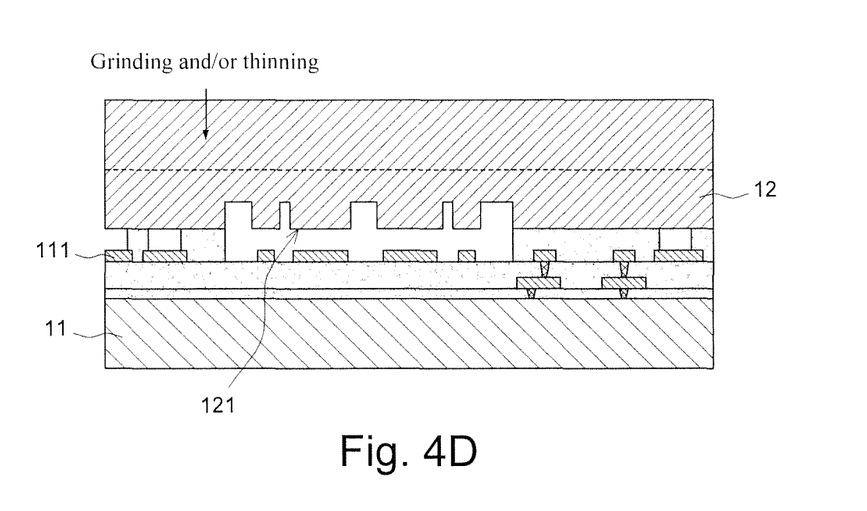

Referring to FIG. 4D, the second substrate 12 is bonded to the first substrate 11 with the first surface 121 facing towards the first substrate 11. The bonding of the second substrate 12 and the first substrate 11 may be implemented using at least one of fusion bonding, eutectic bonding, conductive eutectic bonding, soldering, welding and adhesion techniques. In an embodiment, the bonding interface between the first substrate 11 and the second substrate 12 is subject to pressure and heat in order to reflow the conductive material of the bonding interface. Reflow of the conductive material results in a fused bond that provides an ohmic contact between the second substrate 12 and the first substrate 11, as illustrated in FIG. 3B. The bond between the second substrate 12 and the first substrate is a eutectic bond that is conductive. This eliminates the need for providing a separate electrical path for the signals between the MEMS component and the first substrate 11. In some embodiments, the bonding may be achieved using a metal-to-metal fusion bond, e.g. Al—Al, Cu—Cu or Au—Au. In some embodiments, the second substrate 12 is adhesively attached to the first substrate 11 with anisotropic conductive film (ACF).

Figure 4E:
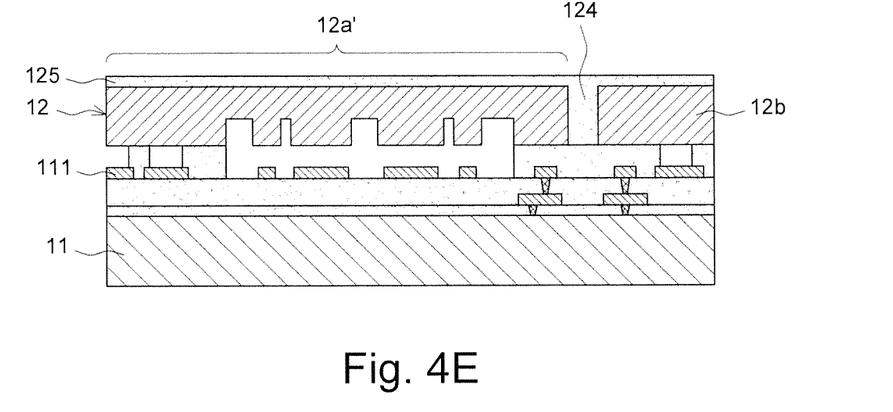

The second substrate 12 is then thinned using a grinding and/or other thinning process to achieve the desired thickness, as illustrated in FIG. 4E. In some embodiments, the remaining thickness of the second substrate 12 after thinning is between 1 μm to 500 μm. Conventional thinning techniques like CMP and/or RIE can be used to achieve the desired thickness. Precision control of the thinning process is utilized since there is no structure that can be used as a stop layer to terminate the thinning process in the embodiment illustrated in FIG. 4D. If not controlled precisely, the thinning may yield a thinner or thicker than desired second substrate 12 affecting the performance of the MEMS device subsequently fabricated. In other embodiments, an etch stop layer is integrated into the second substrate 12 in order to facilitate precision control of the thinning process. One of ordinary skill in the art would recognize many variations, modifications and alternatives.

Referring to FIG. 4E, the second substrate 12 is then divided into a component region 12a' and a conducting part 12b wherein the component region 12a' and the conducting part 12b are electrically isolated. According to an embodiment, a trench 124 is formed in the second substrate 12 such that the second substrate 12 are physically separated into a component region 12a' and a conducting part 12b. Then, dielectric material is filled in the trench 124. In an embodiment, a dielectric layer 125 is formed on the second surface 122 of the second substrate 12, and the trench 124 is meanwhile filled with the dielectric material.

Figure 4F:
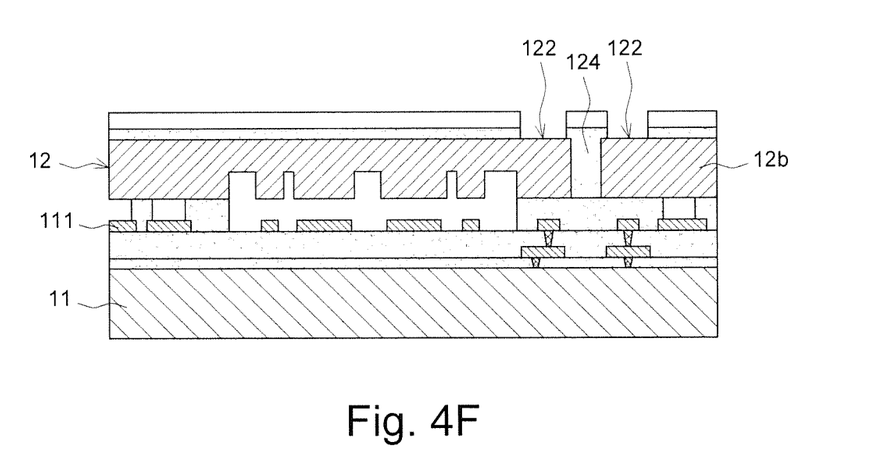
Figure 4G:
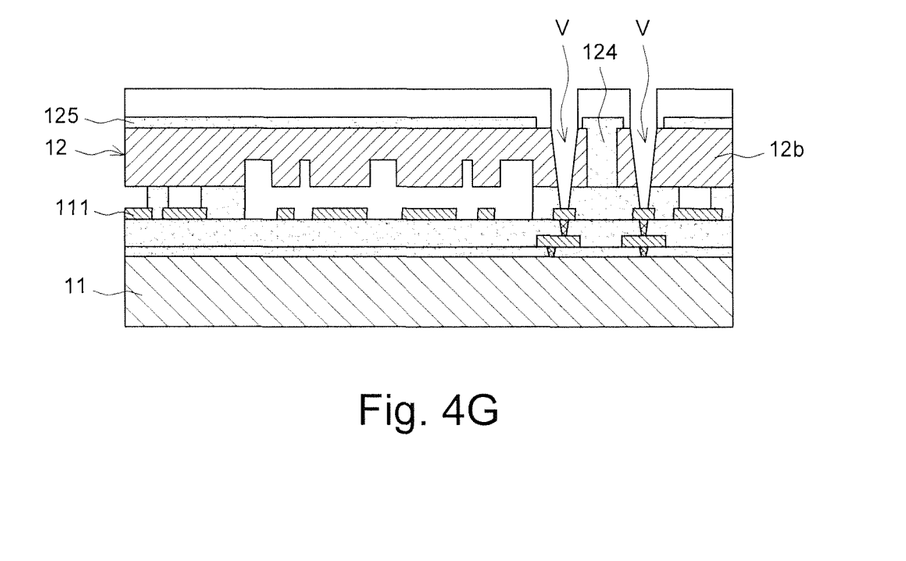

Referring to FIG. 4F, the dielectric layer 125 is patterned and etched, so that the second surface 122 of the second substrate 12 is exposed. There are multiple exposed portions of the second surface 122, and they are distributed on the component region 12a' and the conducting part 12b of the second substrate 12. Then, the second substrate 12 is patterned and etched at the exposed locations of the second surface 12, so as to form a plurality of through-holes V. The through-holes V penetrate the first surfaces 121 and the second surfaces 122 of the component region 12a' and the conducting part 12b, and reach the first circuit 111, as illustrated in FIG. 4G. It is noted that the caliber of the opening of the through-hole V is less than the caliber of the exposed area of the second surface 122.

Figure 4H:
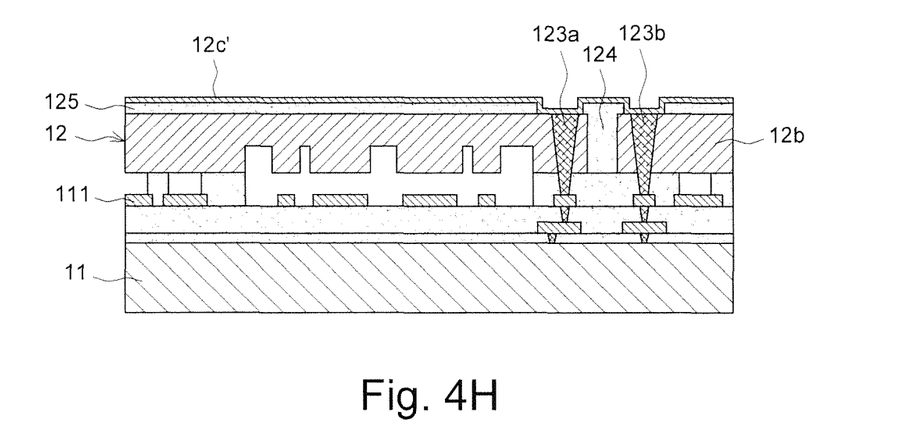
Figure 4I:
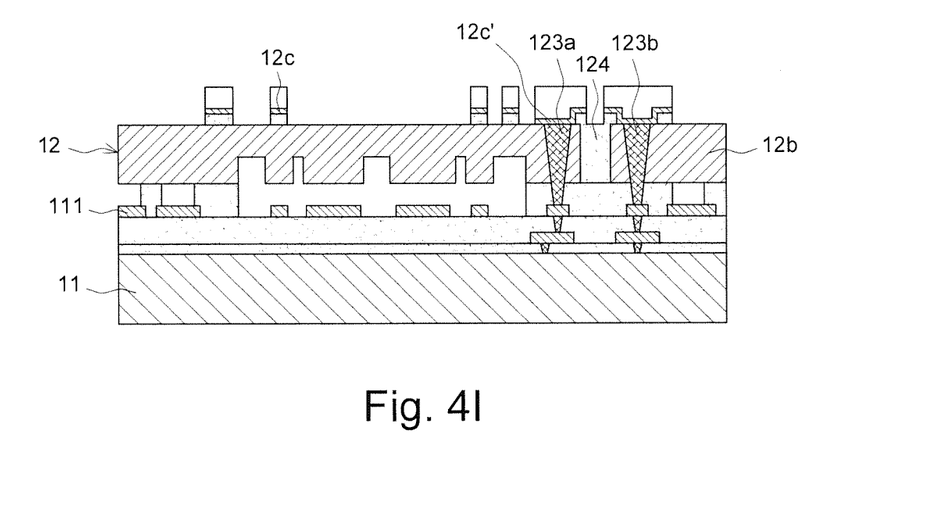

Referring to FIG. 4H, filled with conductive material such as tungsten (W), the through-holes V (denoted in FIG. 4G) then become conducting vias 123a, 123b electrically connected with the first circuit 111. The conducting via 123a may connect electrically with the MEMS component 12a through an ohmic contact formed with the second surface 122 of the MEMS component 12a, the wall of the through-hole V in the MEMS component 123a for accommodating the conducting via 123a and/or the first surface 121 of the MEMS component 123a. Where the ohmic contact is formed with the second surface 122 of the MEMS component 12a, a conductive layer 12c' is formed on the second surface 122 of the second substrate 12. The conductive layer 12c' connects electrically to the conducting vias 123a, 123b, and forms the ohmic contact with the second surface 122 of the second substrate 12 at the exposed locations of the second surface 122. Additionally, the through-hole V may be filled such that the conducting via 123a has an overhang. In this way, the ohmic contact with the second surface 122 of the second substrate 12 is more intact. Where the ohmic contact is formed with the wall of the through-hole V in the MEMS component 123a for accommodating the conducting via 123a, extra care may have to be taken to maintain the wall of the through-hole V substantially free of barrier to electrical conduction such as oxide. And a conductive layer similar to the conductive layer 12c' may be formed on the side wall of the through-hole V to form the ohmic contact with the second substrate 12. Where the ohmic contact is formed with the first surface 121 of the second substrate 12, a conductive layer similar to the conductive layer 12c' may be embedded in the third dielectric layer 112c (denoted in FIG. 4B) and the through-hole may be formed and filled with conductive material before the second substrate is bonded to the first substrate 11. The ohmic contact regions for the conducting via 123a and the second substrate may include at least one of silicon, aluminum-copper alloy, titanium nitride and tungsten Referring to FIG. 4I, the conductive layer 12c' is further patterned and etched to form a second circuit 12c. The second circuit 12c is electrically connected to the conducting via 123b, and is therefore electrically connected with the first circuit 111 through the conducting via 123b. And a portion of conductive layer 12c' electrically connected to the conducting via 123a is formed electrically isolated from the second circuit 12c.

Figure 4J:
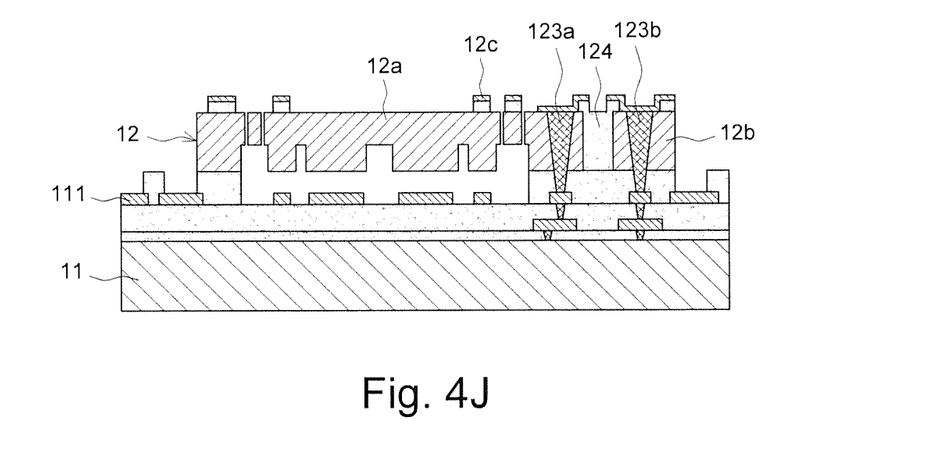

Referring to FIG. 4J, next the second substrate 12 is patterned and etched to form a MEMS component 12a. The patterning and etching techniques used to form the MEMS device 12a vary depending on the type of the MEMS device 12a. Conventional etching techniques like anisotropic etching, RIE or the like may be used here. In some embodiments, the thickness of the second substrate 12 can vary as a function of position along the length of the second substrate 12, where the length is defined along a direction orthogonal to the thickness of the substrate. For example, the second substrate 12 may have a first thickness at one end, a second thickness in the center and a third thickness at the other end. In this instance, the first, the second and the third thickness may be different from each other. By allowing the thickness of the second substrate 12 to be variable, the weight distribution of the second substrate 12 can be tuned to increase the sensitivity of the MEMS device 12a.

Figure 4K:
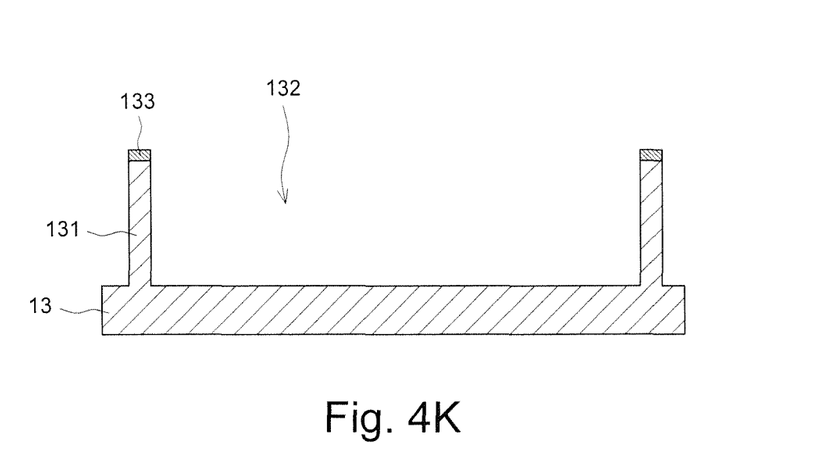

A third substrate 13 is provided as illustrated in FIG. 4K. In some embodiments, the third substrate 13 may include doped silicon, ceramic with conductive plating, glass covered with a conductive coating like tin oxide (ITO) or metal such as tantalum oxide. An adhesive layer is deposited over the third substrate 13. The adhesive layer helps with adhesion between the third substrate 13 and the first substrate 11. In some embodiments, the adhesive layer is formed by depositing a seed layer, e.g., titanium/gold followed by a deposition of a conductive layer, e.g., gold electroplating. The third substrate 13 is then patterned and etched to form a plurality of standoff structures 131. In some embodiments, the standoff structures may have a height of about 90 μm. The etching of the third substrate 13 to form the standoff structures 131 results in a recessed region 132 being formed in the third substrate 13. A portion of the adhesive layer is left on the standoff structures 131 to form bonding pads 133. The recessed region 132 can enclose the second substrate 12. The lateral dimension of the recessed region 132 is selected based on the geometry of the second substrate 12 covered by the third substrate 13.

Figure 4L:
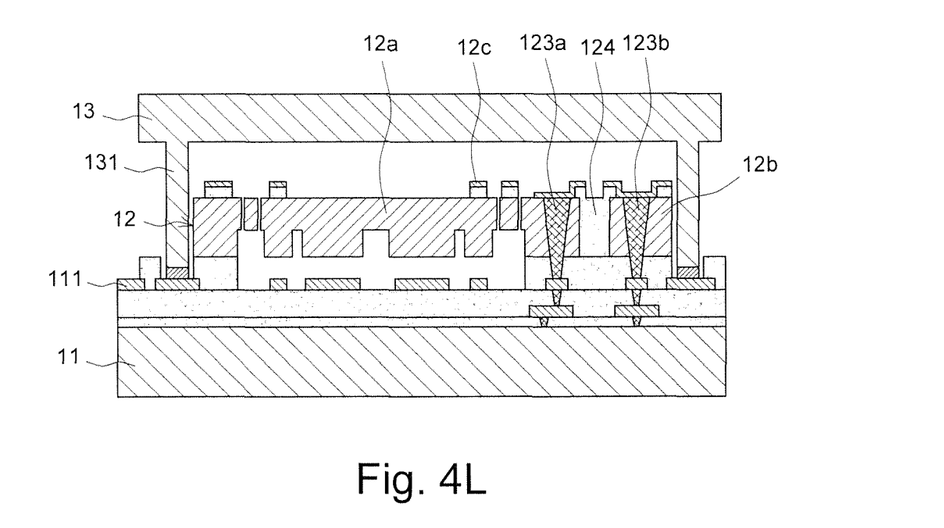

Referring to FIG. 4L, the third substrate 13 is bonded to the first substrate 11 with its standoff structures 131. The connecting step for the third substrate 13 and the first substrate can be implemented using at least one of fusion bonding, glass frit bonding, eutectic bonding, conductive eutectic bonding, soldering, welding and adhesion techniques. In some embodiments, the temperature used for bonding the third substrate 13 to the first substrate 11 is lower than the temperature used for bonding the second substrate 12 to the first substrate 11 in order to protect the MEMS component 12a. In some embodiments, the bonding temperature is below 450° C. The third substrate 13 is conductive and provides shielding to the second substrate 12 from electromagnetic interference (EMI). The third substrate 13 also isolates the second substrate 12 and the electronic devices on the first substrate 11 from the outside environment. Thus, a controlled environment is provided for the MEMS component 12a. In some embodiments, the controlled environment, which can be provided during the operating lifetime of the MEMS device, can include air, dry air, nitrogen, inert gases or the like at atmospheric or reduced pressure. In a particular embodiment, a vacuum environment is provided as the controlled environment. In some applications, various pressures of $SF_6$ or other high dielectric constant gases are utilized. One of ordinary skill in the art would recognize many variations, modifications and alternatives. Lastly, a dielectric layer 134 is formed on the top surface of the third substrate 13, and the MEMS device 1 illustrated in FIG. 1 is completed.

The MEMS device described above can be fabricated as an array with multiple MEMS devices being fabricated on a single substrate. In this instance. substrate-level bonding is performed to enclose each MEMS device within a die. For example, the first substrate includes a plurality of electrical devices, e.g. electrodes, arranged in the form of an array. A plurality of MEMS devices are fabricated on the second substrate and arranged in the form of an array. The second substrate is then bonded to the first substrate and the required conducting paths are formed. Finally, the third substrate with a plurality of recessed regions in the form of an array is boned to the first substrate to enclose each of the MEMS devices in one of the recessed regions. In this manner, multiple MEMS devices can be formed at a time.

To summarize the foregoing description, the MEMS device and the manufacturing method thereof involve dividing the substrate for fabricating the MEMS component into two electrically isolated conductive regions, so that the moving MEMS component and the circuit disposed on its surface may be connected electrically with another substrate below respectively through the corresponding conducting regions. Therefore, there is no need to perform a wire bonding process for the MEMS device and the manufacturing process of the present invention. In such way, not only the configuration of the electrical conducting paths is simplified, but the level of integration of the MEMS device is also increased, thereby simplifying the manufacturing process.

While the invention is susceptible to various modifications and alternative forms, a specific example thereof has been illustrated in the drawings and is herein described in detail. It should be understood, however, that the invention is not to be limited to the particular form disclosed, but to the contrary. the invention is to cover all modifications, equivalents, and alternatives falling within the spirit and scope of the appended claims.

What is claimed is:

1. A MEMS device comprising:
   a first substrate comprising at least a first circuit disposed on a surface of the first substrate;
   a second substrate having a first surface and a second surface, the second substrate comprising:
      a MEMS component divided from the second substrate, disposed on the surface of the first substrate with the first surface facing towards the first substrate, and electrically connected with the first circuit;
      a conducting part divided from the second substrate, electrically isolated from the MEMS component, and electrically connected with the first circuit; and
      a second circuit disposed on the second surface of the MEMS component, electrically isolated from the MEMS component, and electrically connected with the first circuit via the conducting part;
   a third substrate having a recessed region and a plurality of standoff structures, disposed over the second substrate, and connecting to the first substrate with the standoff structures such that the second substrate is enclosed in the recessed region.

2. The MEMS device according to claim 1, wherein the MEMS component comprises a conducting via, wherein the conducting via penetrates through the first surface and the second surface of the MEMS component, and is electrically connected with the first circuit and is electrically connected with the MEMS component through an ohmic contact.

3. The MEMS device according to claim 2, wherein the MEMS component further comprises a conductive layer, wherein the conductive layer is electrically connected with the conducting via, and forms the ohmic contact with the second surface the MEMS component.

4. The MEMS device according to claim 2, wherein the ohmic contact region comprises at least one of silicon, aluminum-copper alloy, titanium nitride and tungsten.

5. The MEMS device according to claim 1, wherein the conducting part comprises a conducting via penetrating the first surface and the second surface of the conducting part, and connecting electrically with the first circuit and the second circuit.

6. The MEMS device according to claim 1, wherein the second circuit forms an ohmic contact with the conducting part at the second surface, and the ohmic contact region comprises at least one of silicon, aluminum-copper alloy, titanium nitride and tungsten.

7. The MEMS device according to claim 1, wherein the first substrate comprises a CMOS substrate.

8. The MEMS device according to claim 1, wherein the second substrate comprises single crystal silicon.

9. The MEMS device according to claim 1, wherein the thickness of the second substrate varies as a function of position along a direction orthogonal to the thickness of the second substrate.

10. The MEMS device according to claim 1, wherein the connection regions of the MEMS component and the first circuit, and the conducting part and the first circuit comprise an alloy comprising at least one of aluminum, copper, germanium, indium, gold and silicon.

11. The MEMS device according to claim 1, wherein the connection regions of the third substrate and the first substrate comprise an alloy comprising at least one of aluminum, copper, germanium, indium, gold and silicon.

12. The MEMS device according to claim 1, wherein the third substrate is conductive and comprises at least one of doped silicon, ceramic with conductive plating, glass with a tin oxide (ITO) coating, and tantalum oxide.

* * * * *